US005863705A

United States Patent [19]
Sezi et al.

[11] Patent Number: 5,863,705

[45] Date of Patent: Jan. 26, 1999

[54] PHOTOLITHOGRAPHIC PATTERN GENERATION

[75] Inventors: Recai Sezi, Röttenbach; Rainer Leuschner; Erwin Schmidt, both of Erlangen, all of Germany

[73] Assignee: Siemens Aktiengesellschaft, München, Germany

[21] Appl. No.: 793,546

[22] PCT Filed: Sep. 1, 1995

[86] PCT No.: PCT/DE95/01187

§ 371 Date: Feb. 21, 1997

§ 102(e) Date: Feb. 21, 1997

[87] PCT Pub. No.: WO96/08751

PCT Pub. Date: Mar. 21, 1996

[30] Foreign Application Priority Data

Sep. 12, 1994 [DE] Germany .......................... 44 32 445.6
Sep. 12, 1994 [DE] Germany .......................... 44 32 447.2

[51] Int. Cl.[6] ...................................................... G03C 5/00

[52] U.S. Cl. ......................... 430/311; 430/312; 430/326; 430/919

[58] Field of Search .................................... 430/326, 331, 430/330, 165, 189, 312, 919

[56] References Cited

U.S. PATENT DOCUMENTS

| | | | |
|---|---|---|---|
| 4,491,628 | 1/1985 | Ito et al. | 430/176 |
| 4,732,836 | 3/1988 | Potvin et al. | 430/192 |
| 5,114,816 | 5/1992 | Scheler et al. | 430/192 |
| 5,124,228 | 6/1992 | Uetani et al. | 430/192 |
| 5,294,521 | 3/1994 | Jacovich et al. | 430/326 |
| 5,308,744 | 5/1994 | Koes | 430/326 |
| 5,314,782 | 5/1994 | Lazarus et al. | 430/165 |
| 5,395,728 | 3/1995 | Jacovich et al. | 430/192 |
| 5,679,495 | 10/1997 | Yamachika et al. | 430/191 |
| 5,726,217 | 3/1998 | Ichikawa et al. | 522/59 |

FOREIGN PATENT DOCUMENTS

| | | |
|---|---|---|
| 0 351 849 | 1/1990 | European Pat. Off. . |
| 0 369 219 | 5/1990 | European Pat. Off. . |
| 0 494 383 | 8/1996 | European Pat. Off. . |
| 4-347857 | 12/1992 | Japan . |
| WO 94/02885 | 2/1994 | WIPO . |

OTHER PUBLICATIONS

Przybilla, K.J., "Delay Time Stable Chemically Amplified Deep UV Resist", SPIE Proc., vol. 1925 (1993), pp. 76–91.

Schwalm, R., "A Robust and Environmentally Stable Deep UV Positive resist: Optimisation of Success ST2", Proc. SPIE, vol. 2195 (1994), pp. 2–13.

Jagannathan, P., "Environmentally Stable Chemically amplified DUV resist based on Diazoketone Chemistry", Proc. SPIE, vol. 2195 (1994), pp. 28–36.

MacDonald, S. et al., "Airborne Chemical Contamination of a Chemically Amplified Resist", SPIE vol. 1466 (1991), pp. 2–12.

Nalamasu, O. et al., "Preliminary Lithographic Characteristics of an All–Organic Chemically Amplified Resist Formulation for Single Layer Deep–UV Lithography", SPIE, vol. 1991, pp. 13–25.

Lamola, A. et al., "Chemically Amplified Resists", *Solid State Technology,* vol. 34, No. 8, Aug. 1991, pp. 53–60.

Spiess[a], W. et al., "Application Aspects of a Positive Tone Deep UV Resist", Microelectronic Engineering, vol. 21 (1993), pp. 267–270.

Bargon, J., (ed). "Methods and Materials in Microelectronic Technology", Plenum Press, New York (1984), pp. 190–193.

*Primary Examiner*—Janet Baxter
*Assistant Examiner*—Rosemary Ashton
*Attorney, Agent, or Firm*—Kenyon & Kenyon

[57] ABSTRACT

The invention concerns a photolithographic method of producing sub-micron structural features by applying to a substrate a photosensitive resist layer consisting of a polymer containing tert-butyl ester or tert-butoxycarbonyloxy groups, a photosensitive component (in the form of an ester of naphthoquinonediazide-4-sulfonic acid and an aromatic hydroxy compound) and a suitable solvent. The photoresist is then dried, exposed in an imaging manner, subjected to a temperature treatment in the range between 120° and 150° C. for a period of 100 to 600 seconds, and wet-developed (single-layer resist system). The invention also concerns a method in which a corresponding two-layer resist system is used.

19 Claims, No Drawings

PHOTOLITHOGRAPHIC PATTERN GENERATION

BACKGROUND OF THE INVENTION

The invention concerns a method of producing sub-micron photolithographic patterns by means of a wet-developable single-layer resist system or by means of a two-layer resist system.

Chemically amplified resists are widely used in micro-electronics (cf. "Solid State Technology," Vol. 34 (1991), No. 8, pages 53 to 60). Chemical amplification is used both in wet-developable single-layer resists and in entirely or partly dry-developable resists. The resists can, in this context, operate on the principle of acid-catalyzed cleavage, in which chemical groups, for example carboxyl groups or phenolic hydroxyl groups, that are polar but are blocked with a protective group are deblocked by means of a photolytically produced acid, and the resist changes polarity in the exposed areas. This change in polarity can be used, for example, for development or for a selective silylation.

For rapid detachment of the protective group, the resist is subjected after exposure to a temperature treatment (post-exposure bake=PEB) which initiates or accelerates the deblocking. Examples of blocking groups are tert-butyl ester and tert-butoxycarbonyloxy (t-BOC) groups. The polarity change results in differing solubility in the exposed and unexposed areas, i.e. the resist can, with suitable developers, be specifically developed either positively (exposed areas dissolved away) or negatively (unexposed areas dissolved away).

The resist generally consists of at least two solid constituents, i.e. of a base polymer that has the tert-butyl ester or t-BOC groups, and a photoactive acid former. Resists containing polymers with such groups are known, for example, from U.S. Pat. No. 4,491,628. The acid former is preferably anonium compound such as diphenyliodonium and triphenylsulfonium trifluoromethanesulfonate, or the corresponding hexafluoroarsenates. Resists of this kind are particularly suitable for photostructuring in the sub-micron and sub-half-micron range.

Published EP Application 0 494 383 discloses a photolithographic pattern generation using the two-layer resist technique in which—following exposure, a subsequent temperature treatment (post-exposure bake=PEB), and development—silylation occurs from the liquid phase followed by anisotropic etching in an oxygen plasma. Positive or negative structures are produced depending on the type of silylation solution. The resist generally consists of at least two solid constituents, i.e. of a base polymer and a photoactive acid former. The base polymer contains carboxylic acid anhydride and tert-butyl ester partial structures, and the acid former is preferably anonium compound such as diphenyliodonium and triphenylsulfonium trifluoromethanesulfonate. A resist of this kind is particularly suitable for photo patterning in the sub-micron and sub-half-micron range with very steep sidewalls.

In the production of patterns features in the manner mentioned above, as in other known resist systems operating according to the principle of acid-catalyzed cleavage or that of chemical amplification, the so-called "delay time effect" has been noted. Specifically, if the delay time between exposure and temperature treatment (PEB) exceeds a certain value, considerable discrepancies occur between the nominal pattern dimension (pattern size on the mask) and the imaged pattern (pattern size in the resist after development). The longer this delay time, the greater the discrepancy.

Above a certain value for the delay time, for example about 30 minutes in the case of anhydride group-containing resists of the type mentioned above, almost no patterns are recognizable after development. The tolerable delay time for these resists is approximately 5 to 10 minutes; for production-engineering reasons, however, a delay time of this kind cannot be accepted.

For a positive resist effective in the deep UV range, for example, a delay time of 1 hour is indicated (see "Microelectronic Engineering," Vol. 21 (1993), pages 267 to 270). Substantially longer delay times would be desirable for production, however; it would be advantageous if exposed resists could, if necessary, even be stored overnight, i.e. if the delay time were 15 hours or more.

This problem is generally known, and is attributed to alkaline contamination in the air which deactivates the photochemically generated strong acid during the delay time. It has therefore already been proposed to solve this problem by filtering the air using activated carbon (see "Proc. SPIE," Vol. 1466 (1991), pages 2 to 12). This, however, requires large investments. Other actions, for example the addition of additives, also have not resulted in a decisive attenuation of the delay time effect (see "Proc. SPIE," Vol. 1466 (1991), pages 13 to 25). It is possible to extend the delay time by applying an additional layer, but only to a minor extent. Moreover this action constitutes an additional process step, which is however undesirable in production because it leads to yield losses.

SUMMARY OF THE INVENTION

It is the object of the invention to indicate a method, operating on the principle of acid-catalyzed cleavage, for production of photolithographic features with which, in resist systems of the kind indicated initially, the delay time problem can be solved without additional process steps or investment, i.e. the delay time between exposure and temperature treatment can be increased to a level acceptable in terms of production engineering.

DETAILED DESCRIPTION OF THE INVENTION

This is achieved, according to the invention, in that (variant 1):

there is applied onto a substrate a photoresist layer consisting of

- a polymer containing tert-butyl ester or tert-butoxycarbonyloxy groups;
- a photoactive component in the form of an ester of a naphthoquinonediazide-4-sulfonic acid of the following structure

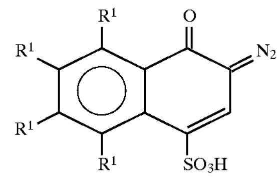

with an aromatic hydroxy compound of the following structure

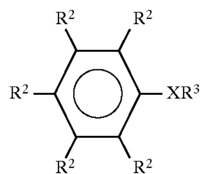

such that the following apply:

$R^1$=H, alkyl, halogenalkyl, alkoxy, phenyl, halogenphenyl, phenoxy, or halogen;

$R^2$=H, OH, alkyl, halogenalkyl, alkoxy, phenyl, halogenphenyl, phenoxy, or halogen;

$R^3$=alkyl, halogenalkyl, phenyl, halogenphenyl, or mono-, di-, or trihydroxyphenyl; and X=CO or $SO_2$, with the stipulation that the hydroxy compound has at least one OH group and that one to four naphthoquinonediazide-4-sulfonic acid groups are bonded, via $SO_2$—O groups, to the hydroxy compound; and a suitable solvent;

the photoresist layer is dried;

the photoresist layer is exposed in an imaging manner;

the exposed photoresist layer is subjected to a temperature treatment in the range between 120° C. and 150° C. for a duration of 100 to 600 seconds; and the photoresist layer treated in this fashion is wet-developed.

The basis for this variant of the method according to the invention is a shelf-stable wet-developable single-layer resist, i.e. positive resist, based on a polymer that possesses tert-butyl ester or tert-butoxycarbonyloxy groups. A resist of this kind has the advantage that it is effective not only in the deep UV (DUV) range, but also in the near UV (NUV) range.

As an alternative to the method described above, it is also possible to proceed (variant 2) as follows:

a bottom resist is applied onto a substrate;

a layer of a photoresist consisting of a polymer containing carboxylic acid anhydride groups and tert-butyl ester or tert-butyoxycarbonyloxy groups;

a photoactive component in the form of an ester of the aforesaid kind; and a suitable solvent is applied onto the bottom resist as a top resist;

the resist layer is dried;

the resist layer is exposed in an imaging manner;

the exposed resist layer is subjected to a temperature treatment in the range between 120° and 150° C. for a duration of 100 to 600 seconds;

the top resist treated in this fashion is wet-developed;

the top resist is silylated; and the bottom resist is dry-developed in an anisotropic oxygen plasma.

The basis for this alternative method according to the invention, which operates according to the two-layer resist technique, is a shelf-stable wet-developable top resist based on a polymer that possesses carboxylic acid anhydride groups alongside tert-butyl ester or tert-butoxycarbonyloxy groups. This resist again has the advantage that it is effective not only in the deep UV (DUV) range, but also in the near UV (NUV) range.

The photoactive component of the resist is an ester made up of a naphthoquinonediazide-4-sulfonic acid and an aromatic hydroxy compound. Photoactive components of this kind are known per se (see "Methods and Materials in Microelectronic Technology," Plenum Press, New York (1984), pages 190 to 193), but in the invention, the fact that a resist containing photoactive component of this kind can be easily pattern is surprising. The reason is that in the production of photolithographic patterns, very strong acid formers are generally needed with base polymers that contain tert-butyl esters. It is also important that the hydroxy compound have a specific structure, namely that of a hydroxyl group-containing aromatic ketone or sulfone. Esters with compounds such as bisphenol-A are specifically not suitable as photoactive components in the case of the method according to the invention.

With the method according to the invention it is essential that the temperature treatment (PEB) last a relatively long time, specifically 100 seconds or more, i.e. between 100 and 600 seconds, and that the PEB temperature be relatively high, specifically 120° to 150° C. With this method, an extension in the delay time of up to 16 hours and more is achieved. The delay time problem is thus solved with no need for new process steps or new materials, and no requirement for new investment.

As compared to current resists, the proportion of photoactive component is much higher in the case of the invention. This proportion is advantageously 20 to 40 wt %, preferably 25 to 35 wt %, in terms of the dry photoresist, i.e. the solvent-free resist composition. Advantageously, the photoactive component can also be a mixture of an ester of the aforesaid kind and anonium compound. Compounds of this kind, which are also referred to as Crivello salts, are for example diphenyliodonium trifluoromethanesulfonate (DPIT) and triphenylsulfonium trifluoromethanesulfonate (TPST). In the ester of the photoactive component, 2,3,4-trihydroxybenzophenone preferably acts as the hydroxy compound.

The polymers used in the method according to the invention are, in the case of the single-layer resist system, i.e. variant 1, preferably those in which the carboxylic acid tert-butyl ester groups are based on tert-butyl esters of acrylic acid, methacrylic acid, vinylbenzoic acid, or cinnamic acid. The tert-butoxycarbonyloxy groups are preferably derived from tert-butoxycarbonyloxystyrene or -maleinimide.

In the case of the two-layer resist system, i.e. variant 2, the polymers used in the method according to the invention are preferably those whose carboxylic acid anhydride groups are derived from maleic anhydride. Another compound of this type is, for example, itaconic acid anhydride. The carboxylic acid tert-butyl ester groups are again preferably based on tert-butyl esters of acrylic acid, methacrylic acid, vinylbenzoic acid, or cinnamic acid, and the tert-butoxy carbonyloxy groups preferably on tert-butoxycarbonyl oxystyrene or -maleinimide.

The bottom resist, which must be resistant to substrate etching processes, generally has an aromatic-containing polymer, usually novolak-based. The bottom resist is baked after application onto the substrate. This results in crosslinking of the polymer, rendering it insoluble in top resist solvents. After baking, the top resist, in which etching resistance to dry development in the oxygen plasma is not necessary, is applied onto the bottom resist. Drying of the top resist is followed by imaging exposure, temperature treatment, wet development (with an alkaline developer), and silylation. The structure then is transferred, in an anisotropic oxygen plasma, into the bottom resist.

Resist solvents known per se are used as solvents. All that is important in selecting the solvent is the requirement that both the polymer component and the photoinitiator, i.e. the photoactive component, must be dissolved. In addition, defect-free resist layers must be formed, using the known coating methods, on the substrates, for example on silicon wafers or on wafers coated with a bottom resist. Preferably the solvent is cyclohexanone, methoxypropyl acetate, or an ethylene glycol or diethylene glycol ether, optionally mixed with dibenzyl ether.

In the method according to the invention, silylation, which occurs from the liquid phase (liquid silylation), makes the top resist etch-resistant to dry development in the oxygen plasma. To this end, the resist layer is treated with a polar, protic silylation solution. The silylation agents used are generally silicon compounds in the form of aminosilanes or aminosiloxanes; these compounds can be oligomeric in nature. The silylation solution is preferably an alcohol solution of the silylation agent; the silylation agent is advantageously dissolved in mixtures of ethanol and isopropanol. In addition, for example, mixtures with other organic solvents can also be used.

The invention will be explained in further detail with reference to exemplary embodiments. The following starting materials or reagents are used (PW=parts by weight):

Base Polymer (1)

Copolymer of methacrylic acid tert-butyl ester and methacrylic acid methyl ester, manufactured by radical polymerization of the two monomers in ethyl acetate with azoisobutyric acid nitrile as initiator.

Base Polymer (2)

Copolymer of methacrylic acid tert-butyl ester and maleic acid anhydride, manufactured by radical polymerization of the two monomers in ethyl acetate with azoisobutyric acid nitrile as initiator.

Photoactive Component (1)

Triester of 2,3,4-trihydroxybenzophenone with naphthoquinonediazide-4-sulfonic acid.

Photoactive Component (2)

Diphenyliodonium trifluoromethanesulfonate (DPIT).

Developer Solution

Aqueous, alkaline-reacting solution in the form of the commercial metal-ion-free photoresist developer NMD-W, 2.38% (Tokyo Ohka Kogyo Co.).

Silylation Solution

Alcohol solution consisting of 4 PW diaminosiloxane, 50.3 PW ethanol, and 45.7 PW isopropanol; preferably an [alpha],[omega]-aminofunctional siloxane, in particular with two end-position aminopropyl groups and 2 to 20 silicon atoms in the chain, is used, for example the commercial product Tegomer A-Si 2120 (Goldschmidt).

EXAMPLE 1

A resist consisting of 9.8 PW base polymer (1), 4.2 PW photoactive component (1), and 86 PW cyclohexanone is spin-coated onto a silicon wafer and dried for 60 seconds at 90° C. on a hotplate; the coating thickness of the resist is 0.31 um. The resist is then contact-exposed through a mask at 17 mJ/cm$^2$ (Karl Süss MJB 3 unit; [λ]=250 nm) and immediately thereafter tempered (PEB) for 120 seconds at 140° C. on the hotplate. The exposed regions are then treated for 60 seconds with the developer solution and dissolved away; a 30-second water rinse then occurs, followed by drying for 60 seconds at 90° C. on the hotplate. Positive patterns with a 1:1 line/space ratio are obtained.

EXAMPLE 2

The procedure is as described in Example 1, but between exposure and tempering the wafer is left for 16 hours in an open wafer tray in the process room. After development, positive patterns with a 1:1 line/space ratio are again obtained. Microscopic examination shows that patterns of the same nominal width have the same width on the wafers according to Example 1 and Example 2.

EXAMPLE 3 (Comparative Experiment)

A resist consisting of 12.2 PW base polymer (1), 0.8 PW photoactive component (2), and 87 PW cyclohexanone is spin-coated onto a silicon wafer and dried for 60 seconds at 90° C. on a hotplate; the coating thickness of the resist is 0.34 um. The resist is then contact-exposed through a mask at 12 mJ/cm$^2$ (Karl Süss MJB 3 unit; [λ]=250 nm) and immediately thereafter tempered (PEB) for 120 seconds at 90° C. on the hotplate. The exposed regions are then treated for 60 seconds with the developer solution and dissolved away; a 30-second water rinse then occurs, followed by drying for 60 seconds at 90° C. on the hotplate. Positive patterns with a 1:1 line/space ratio are obtained.

EXAMPLE 4 (Comparative Experiment)

The procedure is as described in Example 3, but between exposure and tempering the wafer is left for 1 hour in an open wafer tray in the process room. After development, no unequivocal patterning can be detected, i.e. the delay time problem occurs in this context.

EXAMPLE 5

The commercial positive resist TSMR 8900 (Tokyo Ohka Kogyo Co.) is spin-coated onto a silicon wafer (as substrate), and dried for 60 seconds at 90° C.; baking then occurs for 35 minutes in an air-circulation oven at 240° C. After baking, the thickness of the resist, which serves as planarization layer, is 1.1 um.

A photoresist consisting of 9.1 PW base polymer (2), 3.9 PW photoactive component (1), and 87 PW methoxypropyl acetate is spin-coated onto the planarization layer and dried for 60 seconds at 90° C. on a hotplate; the coating thickness of this top resist is 0.3 um. The resist is then contact-exposed through a mask at 19 mJ/cm$^2$ (Karl Süss MJB 3 unit; [λ]=250 nm) and immediately thereafter tempered (PEB) for 120 seconds at 140° C. on the hotplate. The exposed regions are then treated for 90 seconds with the developer solution and dissolved away, then rinsed for 30 seconds with isopropanol and blown dry. The top resist is then treated, at room temperature and standard pressure, i.e. ambient climate, for 90 seconds with the silylation solution, then rinsed for 30 seconds with isopropanol and then dried for 60 seconds at 90° C. on the hotplate. After drying, the wafer is placed in a plasma etching unit (Material Research Corporation model MIE 720), and the resist, including the planarization layer, is first etched with a plasma that contains oxygen (gas flow: 80 sccm) and tetrafluoromethane (gas flow: 9 sccm); the total gas pressure is 8 millitorr, and the bias voltage 40 V. Etching then takes place in a pure oxygen plasma (gas pressure: 2 millitorr; bias voltage: 50 V). Positive structures with vertical sidewalls and a 1:1 line/space ratio are obtained.

EXAMPLE 6

The procedure is as described in Example 5, but between exposure and tempering the wafer is left for 16 hours in an open wafer tray in the process room. After etching, positive patterns with a 1:1 line/space ratio are again obtained. Microscopic examination shows that patterns of the same nominal width have the same width on the etched wafers according to Example 5 and Example 6.

EXAMPLE 7 (Comparative Experiment)

A resist consisting of 13.1 PW base polymer (2), 0.9 PW photoactive component (2), and 86 PW diethylene glycol dimethyl ether is spin-coated onto a planarization layer manufactured in accordance with Example 5 (thickness: 1.1 um) and dried for 60 seconds at 90° C. on a hotplate; the coating thickness of this top resist is 0.33 um. The resist is then contact-exposed through a mask at 11 mJ/cm$^2$ (Karl S üss MJB 3 unit; [λ]=250 nm) and immediately thereafter tempered (PEB) for 60 seconds at 90° C. on the hotplate. The exposed regions are then treated for 60 seconds with the developer solution and dissolved away, then rinsed for 30 seconds with isopropanol and blown dry. The top resist is then treated, at room temperature and standard pressure, i.e. ambient climate, for 90 seconds with the silylation solution, then rinsed for 30 seconds with isopropanol and then dried for 60 seconds at 90° C. on the hotplate. After drying, the resist including the planarization layer is etched in a plasma etching unit as described in Example 5. Positive patterns with vertical sidewalls and a 1:1 line/space ratio are obtained.

EXAMPLE 8 (Comparative Experiment)

The procedure is as described in Example 7, but between exposure and tempering the wafer is left for 1 hour in an open wafer tray in the process room. After etching, no unequivocal patterning can be detected, i.e. the delay time problem occurs in this context.

What is claimed is:

1. A method of producing sub-micron photolithographic patterns, comprising the steps of:

applying onto a substrate a photoresist layer comprising a polymer containing tert-butyl ester or tert-butoxycarbonyloxy groups;

a photoactive component in the form of an ester of a naphthoquinonediazide-4-sulfonic acid of the following structure

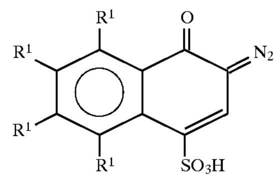

with an aromatic hydroxy compound of the following structure

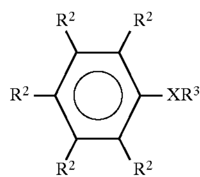

wherein:

R$^1$=H, alkyl, halogenalkyl, alkoxy, phenyl, halogenphenyl, phenoxy, or halogen;

R$^2$=H, OH, alkyl, halogenalkyl, alkoxy, phenyl, halogenphenyl, phenoxy, or halogen;

R$^3$ =alkyl, halogenalkyl, phenyl, halogenphenyl, or mono-, di-, or trihydroxyphenyl; and X=CO or $SO_2$, wherein the hydroxy compound has at least one OH group and wherein one to four naphthoquinonediazide-4-sulfonic acid groups are bonded, via $SO_2$—O groups, to the hydroxy compound; and a suitable solvent;

drying the photoresist layer;

exposing the photoresist layer imagewise;

subjecting the exposed photoresist layer to a temperature treatment in the range between 120° and 150° C. for a duration of 100 to 600 seconds; and wet-developing the photoresist layer so treated.

2. The method as defined in claim 1, wherein the hydroxy compound is 2,3,4-trihydroxybenzophenone.

3. The method as defined in claim 1, wherein the proportion of photoactive component in the photoresist is 20 to 40 wt %.

4. The method as defined in claim 1, wherein an onium compound is added to the photoactive component.

5. The method as defined in claim 1, wherein a polymer whose tert-butyl ester groups are based on tert-butyl esters of acrylic acid, methacrylic acid, vinylbenzoic acid, or cinnamic acid is used.

6. The method as defined in claim 5, wherein a copolymer of methacrylic acid tert-butyl ester and methacrylic acid methyl ester is used.

7. The method as defined in claim 1, wherein a polymer whose tert-butoxycarbonyloxy groups are based on tert-butoxycarbonyloxystyrene or -maleinimide is used.

8. The method as defined in claim 1, wherein the proportion of photoactive component in the photoresist is 25 to 35 wt %.

9. A method of producing sub-micron photolithographic patterns, comprising the steps of applying a bottom resist onto a substrate;

applying a layer of a photoresist onto the bottom resist as a top resist, said layer comprising a polymer containing carboxylic acid anhydride groups and tert-butyl ester or tert-butyoxycarbonyloxy groups;

a photoactive component in the form of an ester of a naphthoquinonediazide-4-sulfonic acid of the following structure

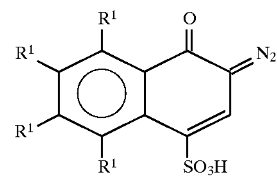

with an aromatic hydroxy compound of the following structure

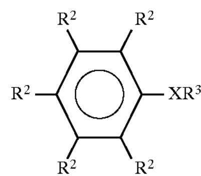

wherein:

R$^1$=H, alkyl, halogenalkyl, alkoxy, phenyl, halogenphenyl, phenoxy, or halogen;

R$^2$=H, OH, alkyl, halogenalkyl, alkoxy, phenyl, halogenphenyl, phenoxy, or halogen;

$R^3$=alkyl, halogenalkyl, phenyl, halogenphenyl, or mono-, di-, or trihydroxyphenyl; and X=CO or $SO_2$, wherein the hydroxy compound has at least one OH group and wherein one to four naphthoquinonediazide-4-sulfonic acid groups are bonded, via $SO_2$—O groups, to the-hydroxy compound; and a suitable solvent;

drying the resist layer;

exposing the resist layer imagewise;

subjecting the exposed resist layer to a temperature treatment in the range between 120° and 150° C. for a duration of 100 to 600 seconds;

wet-developing the top resist so treated;

silylating the top resist; and dry-developing the bottom resist in an anisotropic oxygen plasma.

10. The method as defined in claim 9, wherein a polymer whose carboxylic acid anhydride groups are based on maleic acid anhydride is used.

11. The method as defined in claim 10, wherein a copolymer of maleic acid anhydride and methacrylic acid tert-butyl ester is used.

12. The method as defined in claim 9, wherein a polymer whose tert-butyl ester groups are based on tert-butyl esters of acrylic acid, methacrylic acid, vinylbenzoic acid, or cinnamic acid is used.

13. The method as defined in claim 9, wherein silylation occurs with a polar, protic silylation solution.

14. The method as defined in claim 13, wherein an alcohol solution of an aminosiloxane, in particular a solution in a mixture of ethanol and isopropanol, is used as the silylation solution.

15. The method as defined in claim 9, wherein the hydroxy compound is 2,3,4-trihydroxybenzophenone.

16. The method as defined in claim 9, wherein the proportion of photoactive component in the photoresist is 20 to 40 wt %.

17. The method as defined in claim 9, wherein an onium compound is added to the photoactive component.

18. The method as defined in claim 9, wherein a polymer whose tert-butoxycarbonyloxy groups are based on tert-butoxycarbonyloxystyrene or -maleinimide is used.

19. The method as defined in claim 9, wherein the proportion of photoactive component in the photoresist is 25 to 35 wt %.

* * * * *